United States Patent [19]

Ohta

[11] Patent Number: 5,352,905
[45] Date of Patent: Oct. 4, 1994

[54] SEMICONDUCTOR SURGE SUPPRESSOR

[75] Inventor: Koichi Ohta, Saitama, Japan

[73] Assignee: Shindengen Electric Manufacturing Co., Ltd., Tokyo, Japan

[21] Appl. No.: 946,092

[22] Filed: Sep. 17, 1992

[30] Foreign Application Priority Data

Nov. 27, 1991 [JP] Japan .................. 3-335859

[51] Int. Cl.$^5$ .................. H01F 29/08; H01F 29/10
[52] U.S. Cl. .................. 257/38; 257/110; 257/111; 257/112; 257/173
[58] Field of Search .............. 257/110, 111, 112, 173, 257/355, 38

[56] References Cited

U.S. PATENT DOCUMENTS

| | | | |
|---|---|---|---|
| 3,391,310 | 6/1968 | Gentry | 257/110 |
| 3,907,615 | 9/1975 | Weijland | 257/110 |
| 4,282,555 | 8/1981 | Svedberg | 361/56 |
| 4,644,437 | 2/1987 | Robe | 361/56 |
| 4,905,119 | 2/1990 | Webb | 361/119 |
| 4,967,256 | 10/1990 | Pathak et al. | 357/38 |

FOREIGN PATENT DOCUMENTS

| | | | |
|---|---|---|---|
| 2016783 | 9/1971 | Fed. Rep. of Germany | 257/110 |
| 3233973 | 10/1991 | Japan | 257/110 |

Primary Examiner—William L. Sikes
Assistant Examiner—Fetsum Abraham
Attorney, Agent, or Firm—Finnegan, Henderson, Farabow, Garrett & Dunner

[57] ABSTRACT

A thyristor type surge suppressor includes a P-type semiconductor substrate, an N-type first semiconductor layer provided in one surface of the semiconductor substrate, an N-type second semiconductor layer provided in the other surface of the semiconductor substrate, a P-type third semiconductor layer formed in the N-type first semiconductor layer so as to provide a plurality of first exposed regions of the N-type first semiconductor layer, a P-type fourth first semiconductor layer formed in the N-type second semiconductor layer so as to provide a plurality of second exposed regions of the N-type second semiconductor layer, a first electrode provided over the P-type third semiconductor layer and the of N-type first exposed regions, and a second electrode provided over the P-type fourth semiconductor layer and the N-type second exposed regions. In such a structure, the N-type first and second exposed regions are disposed so as to be opposed to the P-type fourth semiconductor layer and the P-type third semiconductor layer, respectively.

16 Claims, 8 Drawing Sheets

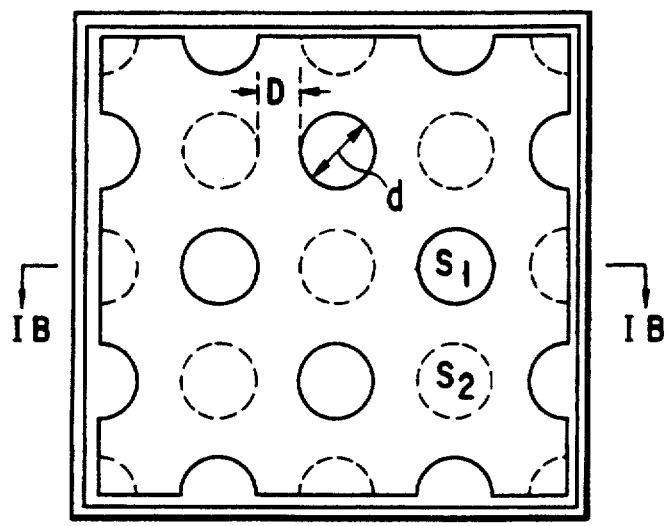
F I G. 1A
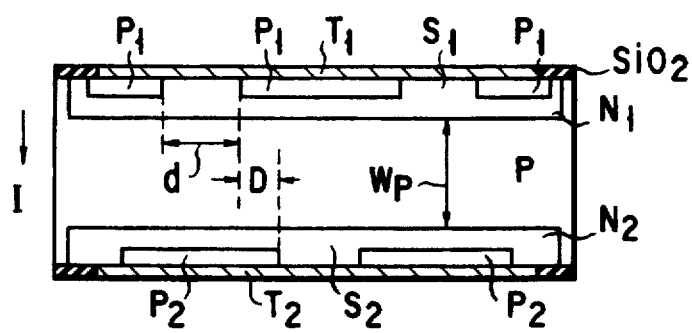
F I G. 1B
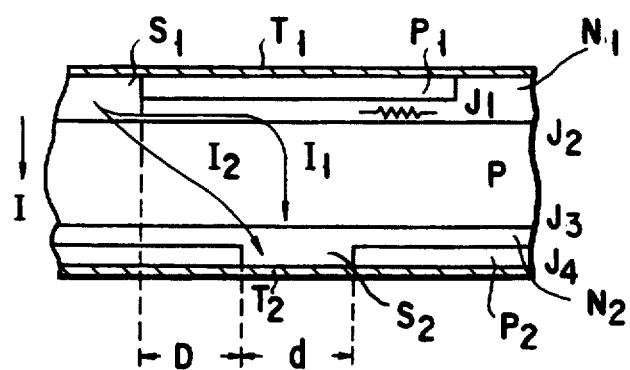
F I G. 1C

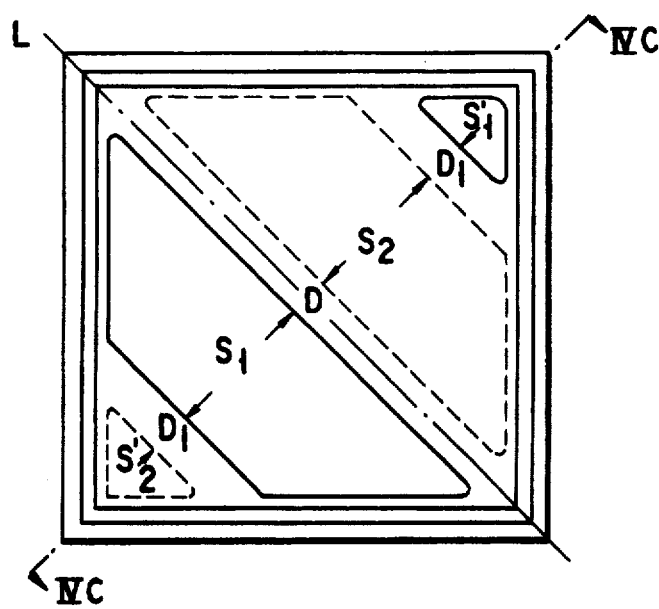
F I G. 4A
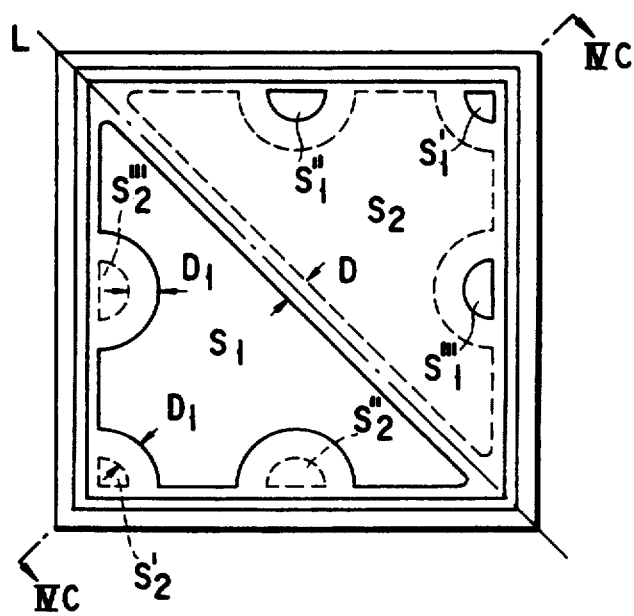
F I G. 4B
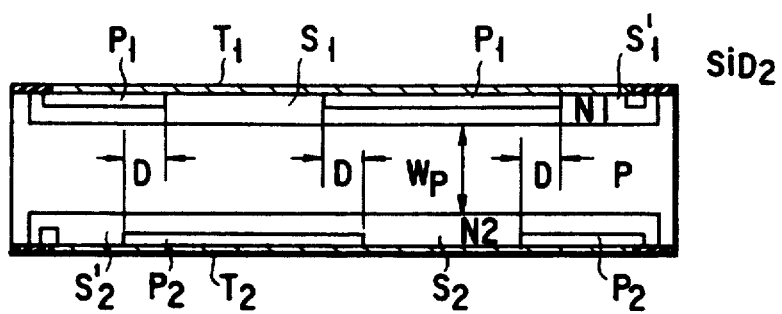
F I G. 4C

SEMICONDUCTOR SURGE SUPPRESSOR

BACKGROUND OF THE INVENTION

1. Field of the Invention

The present invention relates to a thyristor type semiconductor surge suppressor having an excellent breaking performance and an excellent surge operation performance.

2. Description of the Related Art

A bidirectional thyristor type surge suppressor having a basic structure, provided by $P_1N_1PN_2P_2$ layers shown in FIG. 8A, and a current-voltage characteristic shown in FIG. 8B (showing only one direction) has been used as a surge suppressor for various electronic circuits because of its compact size and low cost.

This suppressor is used by connecting it between both terminals of an electronic circuit H to be protected as shown in FIG. 9. For example, when a surge voltage S having a voltage value exceeding $V_{BO}$ of the surge suppressor Z in FIG. 8B is applied to a line of the electronic circuit H, the surge suppressor Z is immediately turned on to protect the electronic circuit H.

In this case, it it required that after the surge current flows through the surge suppressor Z, a current flowing through the electronic circuit by a power supply voltage $E_0$ is immediately cut off to return the surge suppressor Z to a condition before the application of the surge voltage.

For this reason, as is well known, a holding current $I_H$ of the suppressor Z must satisfy the following relation:

$$I_H > E_0/R$$

where

R: circuit impedance $E_0$: power supply voltage

The holding current $I_H$ must be increased in order to obtain an excellent breaking performance.

As has been known, the holding current $I_H$ is determined by an impurity concentration and a thickness of respective layers of the thyristor type surge suppressor Z. However, the impurity concentration and the thickness cannot be easily controlled with high precision.

On the other hand, an increase in the holding current $I_H$ results in a decrease in a surge current capacity. Therefore, it is not always easy to increase the holding current $I_H$ and the surge current capacity at the same time. In addition, it is difficult to make the thyristor type surge suppressor since the impurity concentration must be precisely controlled.

In order to eliminate such problems, a thyristor type surge suppressor having a structure shown in FIGS. 10A and 10B has been proposed.

That is, an N-type base region $N_1$ is provided on one surface of a P-type semiconductor substrate P, and an N-type base region $N_2$ is formed on the other surface of the P-type semiconductor substrate P. A P-type emitter region $P_1$ is formed in the base region $N_1$ to expose a plurality of circular regions $S_1$, and a P-type emitter region $P_2$ is formed in the base region $N_2$ to expose a plurality of circular regions $S_2$. An electrode $T_1$ is provided over the exposed base regions $S_1$ and the emitter region $P_1$, and an electrode $T_2$ is provided over the exposed base regions $S_2$ and the emitter region $P_2$.

According to the semiconductor surge suppressor having the structure, as is apparent from the following operation, the holding current $I_H$ can be increased by the number of base regions $S_1$ and $S_2$ and their arrangement as compared with the conventional surge suppressor having no exposed base regions $S_1$ and $S_2$.

However, if the number of the exposed base regions and the area of each of the exposed base regions are increased to increase the holding current $I_H$, a switching current $I_S$ shown in FIG. 8B is increased in proportion to the holding current $I_H$. Therefore, even if the breaking performance can be improved, the operation performance against the surge is lowered.

First, considering that the semiconductor surge suppressor is turned on in a direction directed from the electrode $T_1$ to the electrode $T_2$. When an applied voltage exceeds a breakdown voltage $V_{BO}$ of a junction $J_2$, a current I consisting of current components $I_0$, $I_1$, and $I_2$ flows through the surge suppressor as shown in FIG. 10B. When a junction $J_1$ is forward-biased by a voltage drop that is given by the current component $I_1$ and an effective lateral resistance $R_N$ of the base region $N_1$, and the bias voltage exceeds the rise voltage of the junction $J_1$, holes are then injected into the base region $N_1$ from the Junction $J_1$, so that a current flows between the electrodes $T_1$ and $T_2$. For this reason, the switching current $I_S$ is increased as compared with the structure having no exposed base regions $S_1$.

Second, considering the turn-on state. The device does not conduct Just under the base regions $S_1$, but conducts in only a portion Just under the emitter region $P_1$. The turn-on state is kept by injection of holes from the junction $J_1$ and injection of electrons from a junction $J_3$. In addition, when the ON-sate is lowered to turn off the device, the holes injected from the junction $J_1$ are recombined in the exposed base regions $S_1$. Therefore, the effective injection efficiency is decreased to increase the holding current $I_H$ as compared with that of the structure having no exposed base regions $S_1$.

The effect of increasing the switching current $I_S$ and the holding current $I_H$ caused by the above operational mechanism is enhanced as the effective lateral resistance $R_N$ of the base region $N_1$ along the path of the current component $I_1$ in FIG. 10B is reduced. Therefore, it is apparent that the effect described above is increased as the number of exposed base regions $S_1$ is increased.

On the other hand, the current component $I_0$ directly flowing from the base region $N_1$ to the base region $N_2$ shown in FIG. 10B is a reactive current that does not contribute to the turn-on operation, which increases only the switching current $I_S$ as an additional current. Although the current component $I_2$ is also a reactive current, its description will be omitted since it is the same as that in FIG. 8A.

As a result, in the structure shown in FIGS. 10A and 10B, when the number of exposed base regions $S_1$ is increased, the holding current $I_H$ is sufficiently increased. However, the unwanted current component $I_0$ flows through the device in proportion to the number of the exposed base regions $S_1$ and their total area to increase the switching current $I_S$, thereby degrading the surge operation performance.

In addition, when the thyristor type bidirectional surge suppressor is turned on, a portion of the device to be most easily turned on is first turned on, and the turned-on region extends over the entire area of the device. Therefore, when an extending speed of the turned-on area is slower than the increasing speed of the surge current, a current density is excessively increased in the turn-on process. When the current density exceeds a predetermined limit, the device is broken. For this reason, the surge suppressor cannot sufficiently protect the electronic circuit from the surge current having a short rise time.

Therefore, it is necessary that even when the surge current having the short rise time is applied to the device, the turn-on area is smoothly increased in accordance with the increase in the surge current. However, when the number of exposed base regions $S_1$ shown in FIGS. 10A and 10B is increased to increase the holding current $I_H$, the distance among the base regions $S_1$ is decreased, thereby restricting the extension of the turn-on state over the entire area. For this reason, the surge current capacity is decreased to reduce the surge operation performance.

SUMMARY OF THE INVENTION

It is, therefore, an object of the present invention to provide a semiconductor surge suppressor having a large holding current without requiring a precise process technique.

It is another object of the present invention to provide a semiconductor surge suppressor having improved breaking and surge operation performances.

It is still another object of the present invention to provide a semiconductor surge suppressor for protecting an electronic circuit from a lightning surge current.

According to one aspect of the present invention, there is provided a semiconductor surge suppressor, which includes a semiconductor substrate of one conductivity type, a first semiconductor layer of an opposite conductivity type provided in one surface of the semiconductor substrate, a second semiconductor layer of the opposite conductivity type provided in the other surface of the semiconductor substrate, a third semiconductor layer of the one conductivity type formed in the first semiconductor layer so as to provide a plurality of first exposed regions of the first semiconductor layer, a fourth semiconductor layer of the one conductivity type formed in the second semiconductor layer so as to provide a plurality of second exposed regions of the second semiconductor layer, the plurality of the first and second exposed regions being disposed so as to be opposed to the fourth semiconductor layer and the third semiconductor layer, respectively, a first electrode provided over the third semiconductor layer and the plurality of first exposed regions, and a second electrode provided over the fourth semiconductor layer and the plurality of second exposed regions.

BRIEF DESCRIPTION OF THE DRAWINGS

The novel and distinctive features of the invention are set forth in the claims appended to the present application. The invention itself, however, together with further objects and advantages thereof may best be understood by reference to the following description and accompanying drawings in which:

FIG. 1A is a plan view showing a semiconductor surge suppressor according to a first embodiment of the present invention;

FIG. 1B is a sectional view showing the semiconductor surge suppressor along a line IB—IB in FIG. 1A;

FIG. 1C is a partially enlarged sectional view showing the semiconductor surge suppressor in FIG. 1B;

FIG. 4A is a plan view showing a semiconductor surge suppressor according to a fourth embodiment of the present invention;

FIG. 4B is a plan showing the semiconductor surge suppressor in FIG. 4A;

FIG. 4C is a sectional view showing the semiconductor surge suppressor along a line IVB—IVB in FIGS. 4A and 4B;

DETAILED DESCRIPTION OF THE PREFERRED EMBODIMENTS

Figure 1D:
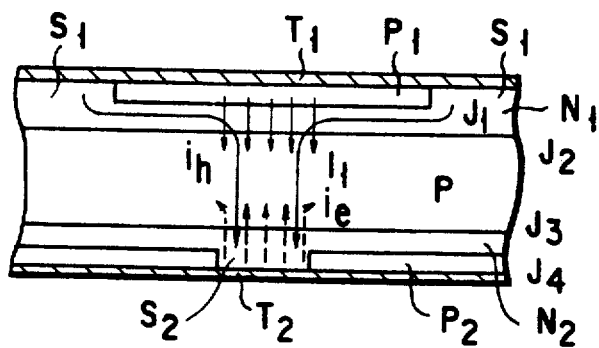
FIG. 1D is a view for explaining a process of turning on the semiconductor surge suppressor in FIG. 1B.

Embodiments of the present invention will be described below with reference to the accompanying drawings. The same reference numerals throughout the accompanying drawings denote the same parts.

A semiconductor surge suppressor according to the first embodiment of the present invention will be described below with reference to FIGS. 1A to 1D. As shown in FIGS. 1A to 1D, using a P-type semiconductor substrate P as a common substrate, an N-type base region $N_1$ is formed on one surface of the semiconductor substrate P, and an N-type base region $N_2$ is formed on the other surface of the semiconductor substrate P. A P-type emitter region $P_1$ is formed in the base region $N_1$ so as to expose a plurality of circular regions $S_1$ each having a diameter d, and a P-type emitter region $P_2$ is formed in the base region $N_2$ so as to expose a plurality of circular regions $S_2$ each having the diameter d. In this case, as shown in FIG. 1A, each of the exposed regions $S_1$ in the base region $N_1$ is spaced apart from each of the region $S_2$ in the base region $N_2$ by a distance D, and they are alternately arranged to form a matrix. As is apparent from FIG. 1B, the exposed base regions $S_1$ and $S_2$ are arranged so as to be opposed to the emitter regions $P_2$ and $P_1$, respectively. In addition, an electrode $T_1$ is provided over the exposed base regions $S_1$ and the emitter region $P_1$, and an electrode $T_2$ is provided over the exposed base regions $S_2$ and the emitter region $P_2$.

According to the structure, two-terminal thyristors each provided by $P_1N_1PN_2$ layers or $P_2N_2PN_1$ layers are provided corresponding to the exposed base regions $S_2$ and $S_1$, respectively. Bidirectional two-terminal thyristors are provided by two-terminal thyristors which are adjacent to one another, and these adjacent two-terminal thyristors are short-circuited to one another by the electrodes $T_1$ and $T_2$. Therefore, when a voltage is applied across the electrodes $T_1$ and $T_2$, one two-terminal thyristor which is most easily turned on is first turned on. Since a gate current flows through P-type layer of adjacent two-terminal thyristors by the conduction, these adjacent two-terminal thyristors are turned on. Subsequently, the turned-on regions extend over the entire area of the device.

On the other hand, when the current amplification factor of the $P_1N_1P$ transistor of the $P_1N_1PN_2$ type two-terminal thyristor and the current amplification factor of the $N_2PN_1$ transistor thereof are represented by $\alpha P$ and $\alpha N$, respectively, the current amplification factors $\alpha P$ and $\alpha N$ depend on a current I flowing through the $P_1N_1PN_2$ type two-terminal thyristor and are reduced by a decrease in the current I. Furthermore, a current which cannot hold the condition of $\alpha P + \alpha N = 1$ is given by the holding current $I_H$. Therefore, in the structure, since the $P_1$ layer and the $N_1$ layer are short-circuited to each other by the electrode T1, the current amplification factor $\alpha P$ of the $P_1N_1P$ transistor is decreased, thereby increasing the holding current $I_H$.

Figure 10A:
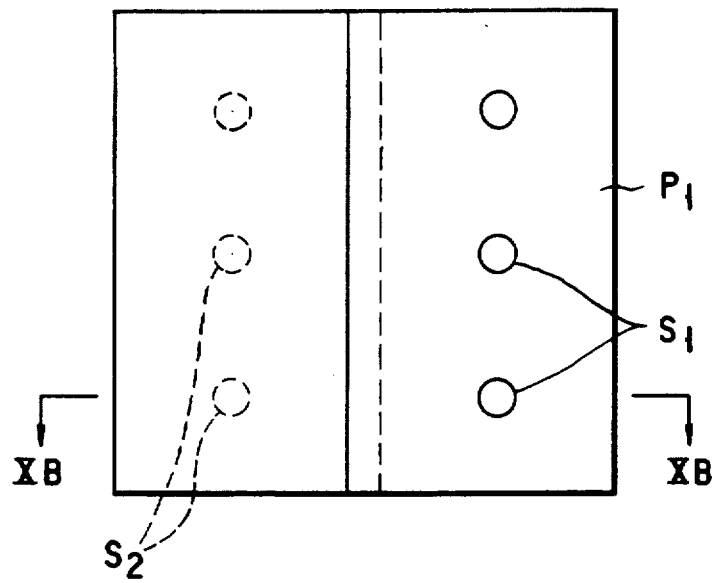
FIG. 10A is a plan view showing an improved conventional semiconductor surge suppressor.
Figure 10B:
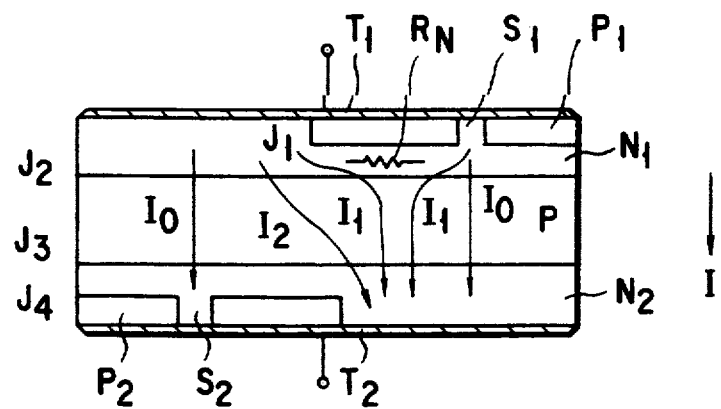
FIG. 10B is a sectional view showing the semiconductor surge suppressor along a line XB—XB in FIG. 10A.

In addition, in the turn-on process, as shown in FIG. 1B, since each of the exposed base regions $S_1$ is opposed to each of the emitter regions $P_2$, the reactive current component $I_0$ is prevented from flowing through the device unlike the conventional structure shown in FIGS. 10A and 10B. For this reason, the surge operation performance is not degraded by an increase in the switching current $I_S$ caused by the current component $I_0$. When a current flows from the electrode $T_2$ to the electrode $T_1$, the same effect as described above can be obtained.

Accordingly, the holding current $I_H$ is increased by controlling the total area of the exposed regions $S_1$ in the base region $N_1$ or the total area of the exposed regions $S_2$ in the base region $N_2$, thereby obtaining a semiconductor surge suppressor having the excellent breaking performance.

Unlike the conventional structure, in the semiconductor surge suppressor of the first embodiment, since unit thyristors are distributed over the entire area of the substrate, heat generated during the turn-on operation is dissipated to increase the current capacity. The same effect as described above can be obtained in the operation directed from the electrode $T_2$ to the electrode $T_1$.

In addition, since each of the unit thyristors is provided corresponding to each of the exposed base regions $S_2$, the problem of the extending speed of the ON-state can be eliminated if the area of each of the base regions $S_2$ is decreased (the number of the regions $S_2$ is increased in the same chip area). For this reason, even if the current density is remarkably increased during the turn-on operation, the suppressor is protected from the breakdown.

In addition to the above structure, when the distance D between each of the exposed base regions $S_1$ and each of the exposed base regions $S_2$ and the diameter d of each of the exposed base regions $S_1$ and $S_2$ are set to satisfy the following conditions, the holding current $I_H$ is increased, and a semiconductor surge suppressor having the excellent breaking performance, the excellent surge operation performance, and the large current capacity can be obtained.

$$W_P/2 \leq D \leq 2W_P \qquad (1)$$

$$W_P \leq d \leq 4W_P \qquad (2)$$

where $W_P$ is the thickness (distance between the base regions $N_1$ and $N_2$) of the semiconductor substrate P.

The operation of the semiconductor surge suppressor having the above structure is as follows.

In an ON-state directed from the electrode $T_1$ to the electrode $T_2$, a current flows through the exposed base regions $S_2$. When the current is decreased to turn off the device, the action of the exposed base regions $S_1$ is the same as that of the base regions $S_1$ of the conventional structure in FIGS. 10A and 10B. Therefore, by increasing the number of exposed base regions $S_1$ and $S_2$ to decrease the distance D between each of the base regions $S_1$ and each of the base regions $S_2$, the holding current $I_H$ can be increased to improve the breaking performance.

As described above, each of the exposed base regions $S_1$ and each of the exposed base regions $S_2$ are spaced apart from each other by the distance D, and the exposed base regions $S_1$ are opposed to the emitter regions $P_2$. In addition, the exposed base regions $S_2$ are opposed to the emitter regions $P_1$. Therefore, the surge operation performance can be further improved by properly defining the distance D (as will be described later) in association with the manufacturing accuracy. Furthermore, the extending speed of the turn-on area during the turn-on process can be further increased by properly defining the diameter d of each of the exposed base regions $S_1$ and $S_2$ (as will be described later) in association with the manufacturing accuracy to increase the current capacity.

That is, as shown in FIG. 1C, in the the turn-on operation, although the current $I_2$ flows obliquely from the base regions $S_1$ to $S_2$ across the semiconductor substrate P, it is the reactive current for the junction $J_1$ and is a factor of increasing the switching current $I_S$. Therefore, the surge operation performance can be improved by decreasing the current $I_2$. The current $I_2$, as understood by considering its current path, depends on the distance D and the thickness $W_P$ of the substrate. For example, when the thickness $W_P$ is kept constant, the current $I_2$ is suddenly increased as the distance D is decreased. When the distance D becomes negative, i.e., when the base regions $S_1$ and $S_2$ are opposed to one another, the current $I_2$ is equal to the reactive current component $I_0$ in the conventional structure shown in FIG. 10B.

In FIGS. 1A to 1C, when the area of each of the exposed base regions $S_1$ and $S_2$ is held constant to increase the distance D, the number of exposed base regions $S_1$ and $S_2$ is decreased to reduce the total area of the exposed base regions, thereby decreasing the current capacity. For this reason, it is not preferable to increase the distance D.

Therefore, the distance D has an optimal range with respect to the thickness $W_P$. When the distance D is optimally defined in consideration of the configuration and arrangement of the exposed base regions, the structure of each layer given by the thickness and the impurity concentration and the manufacturing accuracy, the surge operation performance can be further improved. According to an experiment, the optimal range is given by:

$$W_P/2 \leq D \leq 2W_P$$

The diameter d of each of the exposed base regions $S_1$ and $S_2$ will be described below in relation to the extension of the turned-on area during the turn-on process.

FIG. 1D is a partially enlarged view showing a process in which the current $I_1$ is increased to forward-bias the junction $J_1$, so that the semiconductor surge suppressor begins to be turned on. In the operation directed from the electrode T1 to the electrode T2, the bias voltage of the junction $J_1$ becomes maximum at an upper central portion of each of the exposed base regions $S_2$. Therefore, injection of holes $i_h$ occurs at this portion first. The turn-on operation is started from the portion together with the injection of electrons i.e. from the junction $J_3$, and it extends over the entire area of the exposed base regions $S_2$.

This extending phenomenon is mainly determined by the diffusion of injected carriers (electrons and holes) in the longitudinal and lateral directions. For this reason, the diameter d of each of the exposed base regions $S_2$ depends on the thickness $W_P$ of the P-type semiconductor substrate P. when a value of d/2 is almost equal to $W_P$, the operation time is determined by only a longitudinal carrier moving time. When the value of d/2 exceeds $W_P$, a time required for extending the turn-on state over the entire area of the device is increased.

Therefore, in order to prevent the excessive current density, it is effective that when the suppressor is used to protect a surge current having a short rise time (except for a current having a long rise time, e.g., a commercial AC current), the dimension of each of the exposed base regions $S_2$ has an upper limit. The operation directed from the electrode $T_2$ to the electrode $T_1$ is the same as that described above.

Under the condition that the distance D between each of the exposed base regions $S_1$ and each of the exposed base regions $S_2$ is defined by the formula (1), when the dimension of each of the exposed base regions $S_1$ and $S_2$ is small, the total area of the base regions $S_1$ and $S_2$ for determining the current capacity is decreased in the same chip area. For this reason, the area of each of the exposed base regions $S_1$ and $S_2$ is limited.

Accordingly, when the suppressor is used to protect the surge current having the short rise time, the current capacity is further increased by optimally setting the dimension d of each of the exposed base regions $S_1$ and $S_2$ in relation to the thickness $W_P$ of the P-type semiconductor substrate P.

According to the experiment, in consideration of the configuration and arrangement of the exposed base regions $S_1$ and $S_2$, the structure of each layer rendered by the impurity concentration and the thickness, conditions such as the manufacturing accuracy, and the distance D between each of the exposed base regions $S_1$ and each of the exposed base regions $S_2$, the optimal range of the dimension d is give by:

$$W_P \leq d \leq 4W_P$$

A semiconductor surge suppressor according to the second embodiment of the present invention will be described below with reference to FIGS. 2A and 2B.

Figure 2A:
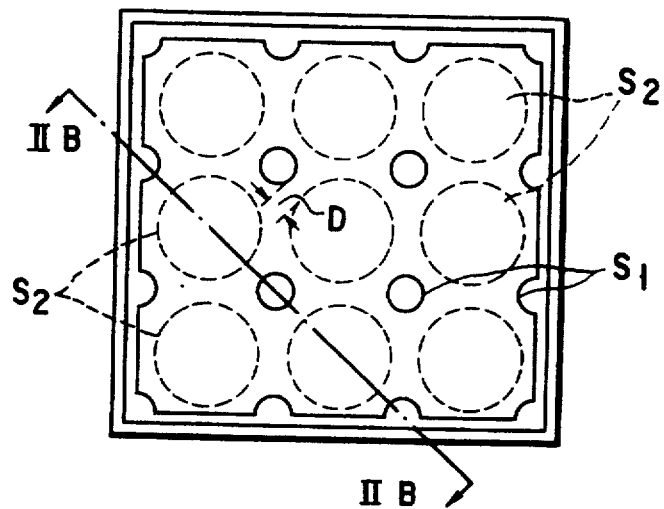
FIG. 2A is a plan view showing a semiconductor surge suppressor according to a second embodiment of the present invention.
Figure 2B:
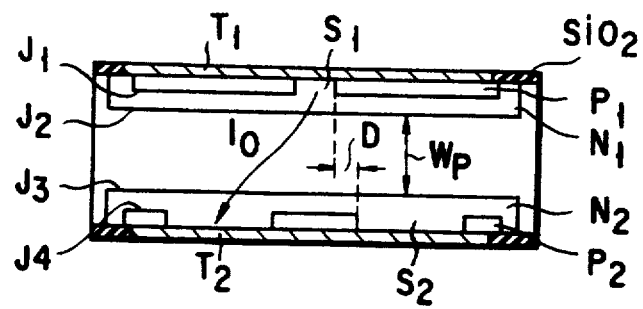
FIG. 2B is a sectional view showing the semiconductor surge suppressor along a line IIB—IIB in FIG. 2A.

FIG. 2A is a plan view showing the semiconductor surge suppressor without depicting the electrodes $T_1$ and $T_2$, and FIG. 2B is a sectional view showing the semiconductor surge suppressor along a line IIB—IIB in FIG. 2A. In this embodiment, each of exposed base regions $S_1$ and each of exposed base regions $S_2$ are different in the diameter d. That is, the area of each of the exposed base regions $S_1$ and the area of each of the exposed regions $S_1$ are provided to satisfy a condition of $S_2 > S_1$. The current capacity directed from the electrode $T_1$ to an electrode $T_2$ is higher than that directed from the electrode $T_2$ to the electrode $T_1$. Except that the area of each of the exposed base regions $S_1$ is different from the area of each of the exposed base regions $S_2$, the semiconductor surge suppressor of the second embodiment is substantially the same as that of the first embodiment, including the condition of $W_P/2 \leq D \leq 2W_P$.

A semiconductor surge suppressor according to the third embodiment of the present invention will be described below with reference to FIGS. 3A and 3B.

Figure 3A:
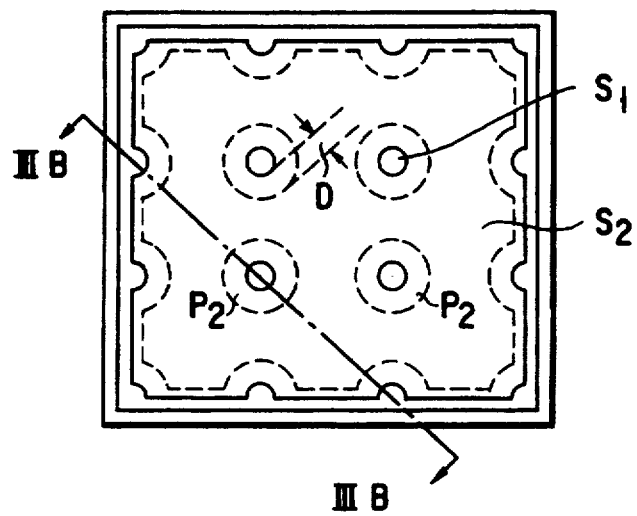
FIG. 3A is a plan view showing a semiconductor surge suppressor according to a third embodiment of the present invention.
Figure 3B:
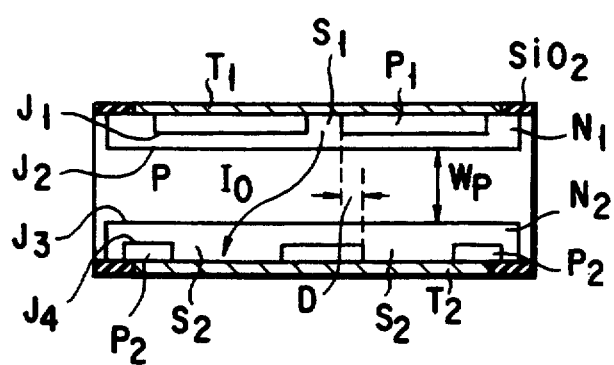
FIG. 3B is a sectional view showing the semiconductor surge suppressor along a line IIIB—IIIB in FIG. 3A.

FIG. 3A is a plan view showing a semiconductor surge suppressor without electrodes $T_1$ and $T_2$, and FIG. 3B is a sectional view showing the semiconductor surge suppressor along a line IIIB—IIIB in FIG. 3A. In this embodiment, the current capacity of one direction is set to be higher than that of the other direction in the same manner as the second embodiment. That is, the exposed base regions $S_2$ are provided by only one continuous region, and each of emitter regions $P_2$ is concentrically provided to each of exposed base regions $S_1$.

A semiconductor surge suppressor according to the fourth embodiment of the present invention will be described below with reference to FIGS. 4A to 4C.

The embodiment employs a square P-type semiconductor substrate P in the same manner as the embodiments described above, and shows the semiconductor surge suppressor having different area and configuration of exposed base regions $S_1$ and $S_2$ in both surfaces.

FIGS. 4A and 4B are plan views showing examples of the semiconductor surge suppressor without depicting electrodes $T_1$ and $T_2$, and FIG. 4C is a sectional view showing the semiconductor surge suppressor along a line IVB—IVB in FIGS. 4A and 4B. In FIG. 4A, exposed trapezoidal base regions $S_1$ and $S_2$, spaced apart from each other by a distance D, are provided, and exposed triangular base regions $S'_2$ and $S'_1$, spaced apart from the base regions $S_1$ and $S_2$ by a distance $D_1$, respectively, are further located so that these base regions are symmetric with respect to a straight line L connecting two opposite angles of the square semiconductor substrate P.

In FIG. 4B, exposed approximately triangular base regions $S_1$ and $S_2$ are arranged so as to be symmetric with respect to a straight line L connecting two opposite angles of the square semiconductor substrate P, and the bases of the triangular exposed base regions $S_1$ and $S_2$ are spaced apart from each other by the distance D. In addition, quarter-circular exposed base regions $S'2$ and $S'1$ are provided to be spaced apart from the base regions $S_1$ and $S_2$ by the distances $D_1$, respectively. Exposed semicircular base regions $S'''_2$ and $S'''_1$, spaced apart from the base regions $S_1$ and $S_2$ by the distances $D_1$, respectively, are provided so as to be opposed to each other at the central portion of opposite sides of the square, and exposed semicircular base regions $S''_2$ and $S''_1$, spaced apart from the base regions $S_1$ and $S_2$ by the distances $D_1$, respectively are also provided so as to be opposed to each other at the central portion of the other opposite sides thereof.

As is apparent from FIG. 4C, the base regions $S_1$, $S'_1$ and the like are opposed to the P-type emitter region $P_2$, and the base regions $S_2$, $S'_2$ and the like are also opposed to P-type emitter region $P_1$ in the same manner as embodiments described above. In the semiconductor surge suppressor having the structure, the main current flows through the two-terminal thyristor corresponding to the exposed base regions $S_1$ and $S_2$. Therefore, the holding currents $I_H$ of these thyristors are increased by the exposed base regions $S'_1$, $S''_1$, and $S'''_1$ and the exposed base regions $S'_2$, $S''_2$, and $S'''_2$, respectively, to improve the breaking performance. In this case, since the conditions of $W_P/2 \leq D$ and $D_1 \leq 2W_P (D=D_1$ or $D \neq D_1)$ are satisfied, the degradation of the surge operation performance can be prevented even if the switching current $I_S$ is increased.

A semiconductor surge suppressor according to the fifth embodiment of the present invention will be described below with reference to FIGS. 5A and 5B.

This embodiment shows a three-terminal semiconductor surge suppressor for certainly protecting an electronic circuit even if a surge voltage is simultaneously applied between the ground and two lines.

Figure 5A:
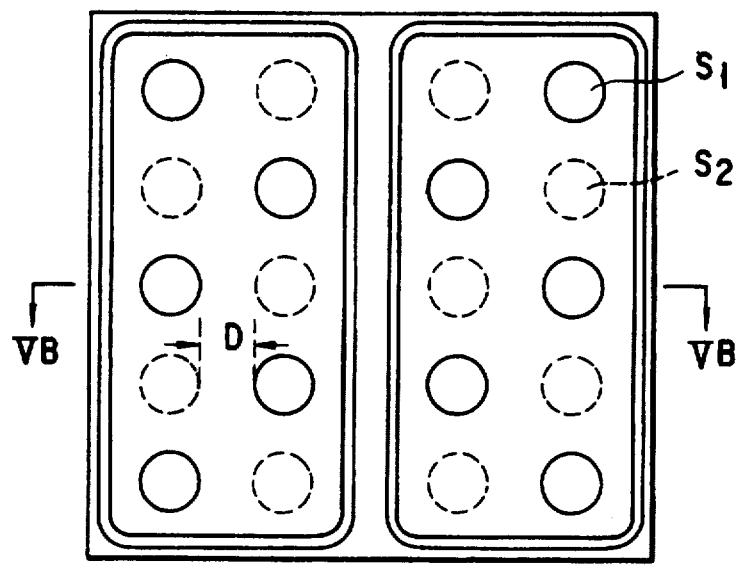
FIG. 5A is a plan view showing a three-terminal semiconductor surge suppressor according to a fifth embodiment of the present invention.
Figure 5B:
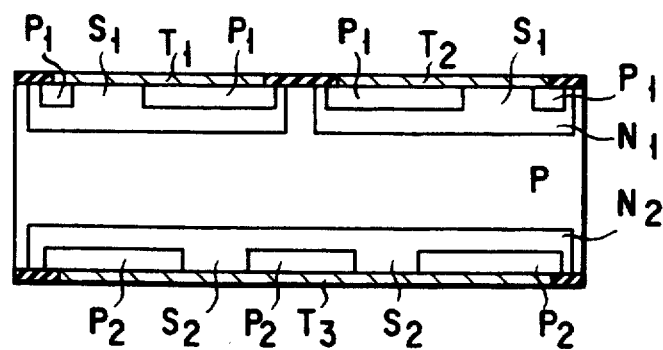
FIG. 5B is a sectional view showing the three-terminal semiconductor surge suppressor along a line VB—VB in FIG. 5A.

FIG. 5A is a plan view showing a three-terminal semiconductor surge suppressor without depicting electrodes $T_1$ and $T_2$, and FIG. 5B is a sectional view showing the semiconductor surge suppressor along a line VB—VB in FIG. 5A. In this embodiment, two base regions $N_1$ separated from each other are provided on one surface of the semiconductor substrate P, and a common base region $N_2$ is provided on the other surface. An emitter region $P_1$ is provided in each of the base regions $N_1$ to expose a plurality of circular regions $S_1$ each having a diameter d, and an emitter region $P_2$ is formed in the base region $N_2$ to expose a plurality of circular regions $S_2$ each having the diameter d. In this case, as shown in FIG. 5A, each of the exposed regions $S_1$ of the base regions $N_1$ and each of the exposed regions $S_2$ of the base region $N_2$ are alternately arranged so as to be spaced apart from each other by the distance D. The electrodes $T_1$ and $T_2$ are provided over the exposed regions $S_1$ and the emitter region $P_1$ in the base regions $N_1$, respectively, and an electrode $T_3$ is formed over the exposed regions $S_2$ and the emitter region $P_2$.

Figure 6:
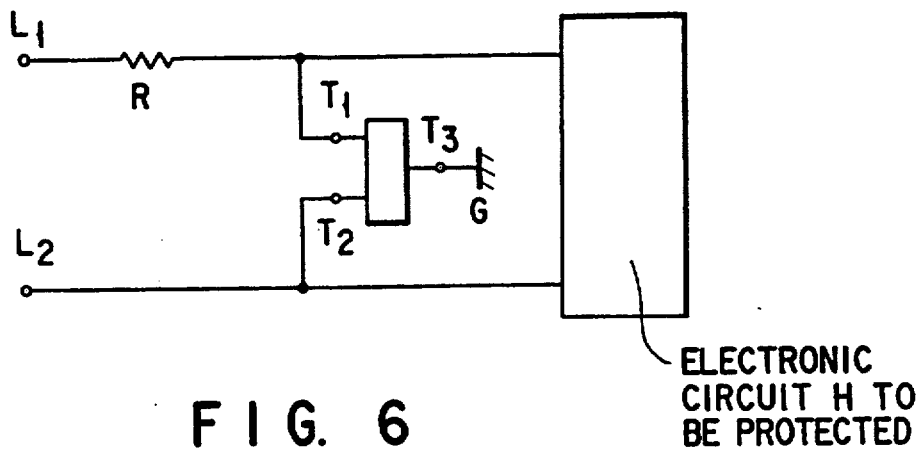
FIG. 6 is a view showing the three-terminal semiconductor surge suppressor (FIG. 5A) applied to a circuit.

FIG. 6 shows a circuit connection in which the above three-terminal semiconductor surge suppressor is applied to an electronic circuit H to be protected. In FIG. 6, the electrodes $T_1$ and $T_2$ are connected to lines $L_1$ and $L_2$, respectively, and the electrode $T_3$ is grounded.

In the above protection circuit, when a surge voltage is applied between the line $L_1$ and ground G, a device portion between the electrodes $T_1$ and $T_3$ is operated. When the surge voltage is applied between the line $L_2$ and the ground G, a device portion between the electrodes $T_2$ and $T_3$ is operated. In addition, even if the surge voltage is applied to the lines $L_1$ and $L_2$ with respect to ground G at the same time, the three-terminal semiconductor surge suppressor is entirely operated to protect the electronic circuit H.

Figure 7:
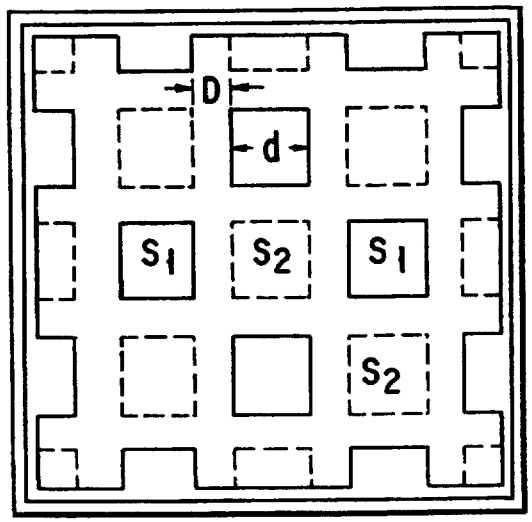
FIG. 7 is a plan view showing a modification of a configuration of exposed base regions $S_1$ and $S_2$ in the semiconductor surge suppressor according to the present invention.
Figure 8A:
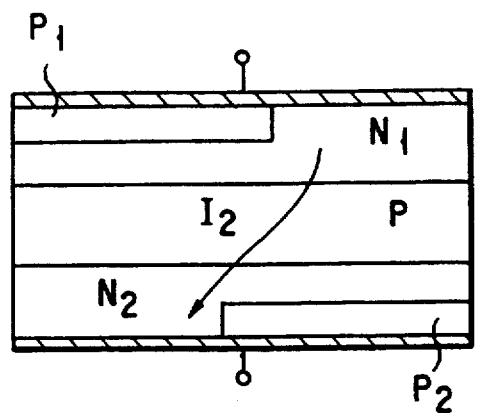
FIG. 8A is a sectional view showing a conventional semiconductor surge suppressor.
Figure 8B:
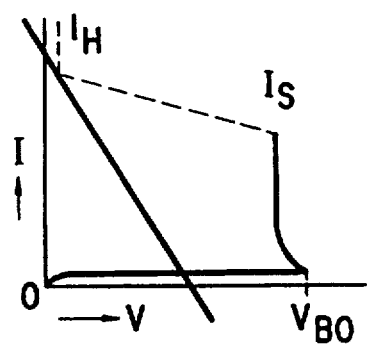
FIG. 8B is a graph showing a characteristic of the conventional semiconductor surge suppressor.
Figure 9:
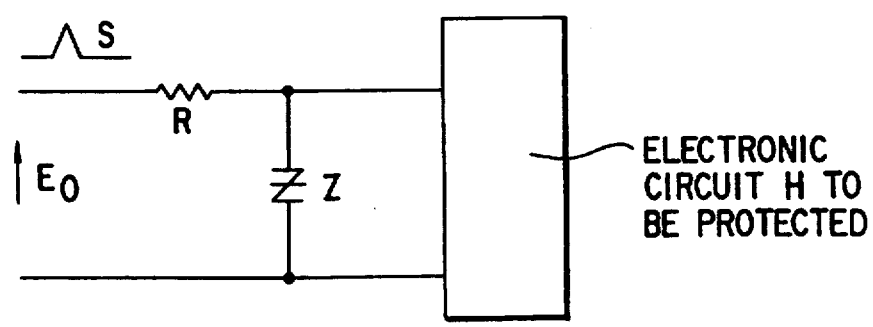
FIG. 9 is a circuit diagram showing a basic operation of the conventional semiconductor surge suppressor.

In the above description, although the configuration of each of the exposed base regions $S_1$ and $S_2$ is provided by the circle, it may be provided by a square having one side given by a length d as shown in FIG. 7.

According to the present invention, there can be provided a semiconductor surge suppressor, having the excellent surge operation performance and the excellent breaking performance, capable of sufficiently protecting an electronic circuit from a surge current such as a lightning surge current having a short rise time. The semiconductor surge suppressor can be effectively adapted to surge protection such as lightning surge protection for a communication circuit.

It is further understood by those skilled in the art that the foregoing description is only of the preferred embodiments and that various changes and modifications may be made in the invention without departing from the spirit and scope thereof.

What is claimed is:

1. A two-terminal semiconductor surge suppressor comprising:
   a semiconductor substrate of a first conductivity type having first and second surface portions opposed to each other;
   a first semiconductor layer of a second conductivity type in the first surface portion;
   a second semiconductor layer of the second conductivity type in the second surface portion;
   a third semiconductor layer of the first conductivity type, in the first semiconductor layer, defining a plurality of first exposed regions of the first semiconductor layer;
   a fourth semiconductor layer of the first conductivity type, in the second semiconductor layer, defining a plurality of second exposed regions of the second semiconductor layer, the plurality of the first exposed regions being opposed to the fourth semiconductor layer, and the plurality of second exposed regions being opposed to the third semiconductor layer;
   a first electrode over the third semiconductor layer and the plurality of first exposed regions; and
   a second electrode over the fourth semiconductor layer and the plurality of second exposed regions,
   wherein a distance D between each of the plurality of first exposed regions and one of the plurality of second exposed regions adjacent thereto, a dimension d of each of the plurality of the first and second exposed regions, and a distance Wp between the first and second semiconductor layers satisfy relationships of
   $Wp/2 \leq D \leq 2Wp$ and $Wp \leq d \leq 4Wp$.

2. The two-terminal semiconductor surge suppressor according to claim 1, wherein each of the plurality of first exposed regions are laterally removed from each of the plurality of second exposed regions.

3. The two-terminal semiconductor surge suppressor according to claim 1, wherein each of the plurality of first exposed regions has a first area and each of the plurality of second exposed regions has an area different than the first area.

4. The two-terminal semiconductor surge suppressor according to claim 1, wherein each of the plurality of first exposed regions has a first configurations and each of the plurality of second exposed regions has a configuration different than the first configuration.

5. The two-terminal semiconductor surge suppressor according to claim 1, wherein the plurality of the first and second exposed regions are alternately arranged in an X-Y matrix of rows and columns.

6. The two-terminal semiconductor surge suppressor according to claim 1, wherein each of the plurality of the first and second exposed regions is circular.

7. The two-terminal semiconductor surge suppressor according to claim 1, wherein each of the plurality of the first and second exposed regions is square.

8. The two-terminal semiconductor surge suppressor according to claim 3, wherein each of the plurality of the first and second exposed regions includes a substantially trapezoid area and a substantially triangular area, arranged symmetrically about a diagonal of the semiconductor substrate.

9. The two-terminal semiconductor surge suppressor according to claim 3, wherein each of the plurality of the first and second exposed regions includes a substantially triangular area, a substantially quadrantal area and a substantially semicircular area, arranged symmetrically about a diagonal of the semiconductor substrate.

10. The two-terminal semiconductor surge suppressor according to claim 9, wherein each of the plurality of first exposed regions is smaller than each of the plurality of second exposed regions when a current flows from the first electrode to the second electrode.

11. The two-terminal semiconductor surge suppressor according to claim 1, wherein the fourth semiconductor layer includes a plurality of regions, each coaxially opposed to one of the plurality of first exposed regions.

12. A three-terminal semiconductor surge suppressor comprising:
- a semiconductor substrate of a first conductivity type having a first surface portion having first and second area, and a second surface portion opposed to the first surface portion;
- a first semiconductor layer of a second conductivity type in the first area of the first surface portion;
- a second semiconductor layer of the second conductivity type in the second area of the first surface portion;
- a third semiconductor layer of the second conductivity type in the second surface portion, the third semiconductor layer being opposed to the first and second semiconductor layers;
- a fourth semiconductor layer of the first conductivity type, in the first semiconductor layer, defining a plurality of first exposed regions of the first semiconductor layer;
- a fifth semiconductor layer of the first semiconductor type, in the second semiconductor layer, defining a plurality of second exposed regions of the second semiconductor layer;
- a sixth semiconductor layer of the first conductivity type formed in the third semiconductor layer so as to provide a plurality of third exposed regions of the third semiconductor layer, the plurality of the first and second exposed regions being opposed to the sixth semiconductor layer, and the plurality of third exposed regions being opposed to the fourth and fifth semiconductor layers;
- a first electrode over the fourth semiconductor layer and the plurality of first exposed regions;
- a second electrode over the fifth semiconductor layer and the plurality of second exposed regions; and
- a third electrode over the sixth semiconductor layer and the plurality of third exposed regions,
- wherein a distance D between each of the plurality of first and second exposed regions and one of the plurality of third exposed regions adjacent thereto, a dimension d of each of the plurality of the first, second and third exposed regions, and a distance Wp between the first and second semiconductor layers and the third semiconductor layer satisfy relationships of $Wp/2 \leq D \leq 2Wp$ and $Wp \leq d \leq 4Wp$.

13. The three-terminal semiconductor surge suppressor according to claim 12, wherein the plurality of the first and third exposed regions are alternately arranged in an X-Y matrix of rows and columns.

14. The three-terminal semiconductor surge suppressor according to claim 12, wherein the plurality of the second and third exposed regions are alternately arranged in an X-Y matrix of rows and columns.

15. The three-terminal semiconductor surge suppressor according to claim 12, wherein each of the plurality of first exposed regions has the same dimension as that of each of the plurality of second exposed regions.

16. The three-terminal semiconductor surge suppressor according to claim 12, wherein the first and second electrodes are coupled to two input lines of an electronic circuit to be protected, and the third electrode is coupled to ground.

* * * * *

UNITED STATES PATENT AND TRADEMARK OFFICE
CERTIFICATE OF CORRECTION

PATENT NO. : 5,352,905
DATED : October 04, 1994
INVENTOR(S) : Koichi OHTA

It is certified that error appears in the above-indentified patent and that said Letters Patent is hereby corrected as shown below:

Claim 4, Column 10, Line 59, change "configurations" to --configuration--.

Claim 12, Column 11, Line 31, change "area" to --areas--.

On the title page item [57], line 14, delete "of".

Signed and Sealed this

Sixteenth Day of May, 1995

BRUCE LEHMAN

Attest:

Attesting Officer

Commissioner of Patents and Trademarks